(12) United States Patent
Zhang et al.

(10) Patent No.: US 10,504,398 B2
(45) Date of Patent: Dec. 10, 2019

(54) DRIVING METHOD FOR DISPLAY PANEL

(71) Applicant: Wuhan China Star Optoelectronics Technology Co., Ltd., Wuhan, Hubei (CN)

(72) Inventors: Tingting Zhang, Guangdong (CN); Chun-hung Huang, Guangdong (CN); Cong Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 76 days.

(21) Appl. No.: 15/749,243

(22) PCT Filed: Nov. 17, 2017

(86) PCT No.: PCT/CN2017/111540
§ 371 (c)(1),
(2) Date: Jan. 31, 2018

(87) PCT Pub. No.: WO2019/051995
PCT Pub. Date: Mar. 21, 2019

(65) Prior Publication Data
US 2019/0088185 A1    Mar. 21, 2019

(30) Foreign Application Priority Data

Sep. 15, 2017   (CN) .......................... 2017 1 0864842

(51) Int. Cl.
*G09G 3/36* (2006.01)
*G09G 3/20* (2006.01)
*H01L 27/12* (2006.01)

(52) U.S. Cl.
CPC ....... *G09G 3/2003* (2013.01); *H01L 27/1214* (2013.01); *G09G 2310/0202* (2013.01); *G09G 2310/0264* (2013.01)

(58) Field of Classification Search
CPC .................................................... G09G 3/2003
See application file for complete search history.

(56) References Cited

U.S. PATENT DOCUMENTS

2017/0221436 A1* 8/2017 Guo ..................... G09G 3/3607

FOREIGN PATENT DOCUMENTS

| CN | 1956048 A | 5/2007 |
|---|---|---|
| CN | 103426410 A | 12/2013 |
| CN | 105185326 A | 12/2015 |
| CN | 105590600 A | 5/2016 |

(Continued)

*Primary Examiner* — Roy P Rabindranath
(74) *Attorney, Agent, or Firm* — Andrew C. Cheng

(57) ABSTRACT

The present invention provides a driving method for a display panel. In an n-th scanning period, the pixel unit on the i-th row and an x-th column receives data signals. At least two subpixels with different colors on the i-th row and the x-th column of pixel unit receive the data signals according to a first sequence. In an (n+1)th scanning period, the pixel unit on the j-th row and an x-th column receives data signals. At least two subpixels with different colors on the j-th row and the x-th column of pixel unit receive the data signals according to a second sequence. A color of the subpixel which last receives the data signal in the first sequence is the same as a color of the subpixel which first receives the data signal in the second sequence.

17 Claims, 3 Drawing Sheets

(56) References Cited

FOREIGN PATENT DOCUMENTS

| | | |
|---|---|---|
| CN | 106531096 A | 3/2017 |
| JP | 2004219823 A | 8/2004 |
| KR | 20140109697 A | 9/2014 |

* cited by examiner

In an n-th scanning period, the pixel unit on an i-th row and an x-th column receives data signals. At least two subpixels with different colors on the i-th row and the x-th column of pixel unit receive the data signals according to a first sequence. — S11

In an (n+1)th scanning period, the pixel unit on the j-th row and an x-th column receives data signals. At least two subpixels with different colors on the j-th row and the x-th column of pixel unit receive the data signals according to a second sequence. — S12

FIG. 2

DRIVING METHOD FOR DISPLAY PANEL

BACKGROUND OF THE APPLICATION

This application claims the priority of an application No. 201710864842.5 filed on Sep. 15, 2017, entitled "DRIVING METHOD FOR DISPLAY PANEL", the contents of which are hereby incorporated by reference.

FIELD OF APPLICATION

The present disclosure relates to the field of display technology, and particularly to a driving method for a display panel.

DESCRIPTION OF PRIOR ART

Currently, display panels are widely used in electronic devices. With the rapid development of display technologies, the display quality of the display panel is getting higher and higher, such as the display brightness, the color reproduction, and the richness of the color of the display panel, which satisfies the user's high requirement of display quality for the display panel. However, to a certain extent, the power consumption of the display panel is increased, and the user demands for the battery life of the electronic device are increasing day by day. Therefore, how to reduce the power consumption of the display panel becomes an urgent problem to be solved.

SUMMARY OF THE APPLICATION

The embodiment of the present invention provides a driving method for a display panel, which can reduce the power consumption of the display panel.

The embodiment of the present invention provides a driving method for a display panel, which comprises a plurality of rows and columns of pixel units arranged in a matrix. Each of the pixel units comprises at least two subpixels with different colors. In each scanning period, scanning signals scan one of the rows of the pixel units. The driving method for the display panel comprises:

In an n-th scanning period, the pixel unit on an i-th row and an x-th column receives data signals. At least two subpixels with different colors on the i-th row and the x-th column of pixel unit receive the data signals according to a first sequence. Wherein n, i, x is a natural number.

In an (n+1)th scanning period, the pixel unit on the j-th row and an x-th column receives data signals. At least two subpixels with different colors on the j-th row and the x-th column of pixel unit receive the data signals according to a second sequence. Wherein j and i are different natural numbers.

A color of the subpixel which last receives the data signal in the first sequence is the same as a color of the subpixel which first receives the data signal in the second sequence. The data signal of the subpixel which last receives the data signal in the first sequence is the same as the data signal of the subpixel which first receives the data signal in the second sequence.

Each column of the pixel units comprises at least two columns of subpixels. Each column of the pixel units corresponds to a data line and a multiplexing switch. The data line is configured to provide the data signals, and the multiplexing switch comprises at least two control switches. Each of the control switches is electrically connected with the data line and one column of subpixels. Each of the control switches is electrically connected to the different columns of subpixels. The driving method for the display panel further comprises:

In the n-th scanning period, the multiplexing switch receives at least two control signals. The at least two control signals control the at least two control switches to let the data lines and the at least two subpixels with different colors of the pixel unit on the i-th row and the x-th column be electrically connected, according to the first sequence.

In the (n+1)th scanning period, the multiplexing switch receives at least two control signals. The at least two control signals control the at least two control switches to let the data lines and the at least two subpixels with different colors of the pixel unit of the j-th row and the x-th column be electrically connected, according to the second sequence.

Wherein each of the control signals controls one of the at least two control switches to turn on. The data line is electrically connected with the subpixel which is electrically connected with the control switch after each of the control switches is turned on.

Wherein each of the pixel units comprises four subpixels with different colors. Each column of the pixel units comprises four columns of subpixels. The multiplexing switch comprises four control switches. An m-th control switch is electrically connected with the data line and the m-th column of subpixels. Wherein m is a natural number between 1 and 4.

Wherein in each scanning period, the multiplexing switch receives four control signals. Each of the control signals comprises four components. The control switch is a thin film transistor. A source electrode of a m-th thin film transistor is electrically connected with the data line, a drain electrode of the m-th thin film transistor is electrically connected with a m-th column of subpixels, and a gate electrode of the m-th thin film transistor receives a m-th component of each control signal in each scanning period.

Wherein each of the pixel units comprises four subpixels with different colors. Each two columns of pixel units comprise eight columns of subpixels. Two adjacent columns of the pixel units correspond to two data lines and a multiplexing switch. The two data lines are used to provide data signals. The multiplexing switch comprises eight control switches. When m is 1 or 4, an m-th control switch is electrically connected with a first data line and an m-th column of subpixels. When m is 2 or 3, the m-th control switch is electrically connected with the first data line and a (m+4)th column of subpixels. When m is 5 or 8, the m-th control switch is electrically connected with a second data line and the m-th column of subpixels. When m is 6 or 7, the m-th control switch is electrically connected to the second data line and the (m−4)th column of subpixels. The driving method for the display panel further comprises:

In the n-th scanning period, the multiplexing switch receives four control signals, a first control switch, a fourth control switch, a sixth control switch, and a seventh control switch are controlled by the four control signals to let the four subpixels with different colors of the pixel unit on the i-th row and x-th column be electrically connected with a corresponding data line according to the first sequence.

In the (n+1)th scanning period, the multiplexing switch receives four control signals, the first control switch, the fourth control switch, the sixth control switch, and the seventh control switch are controlled by the four control signals to let the four subpixels with different colors of the pixel unit on the j-th row and x-th column be electrically connected with a corresponding data line according to the second sequence.

Wherein the scanning signals scan the plurality of pixel units in a progressive manner, wherein i and j have a relationship of j=i+1.

Wherein the scanning signals scan the plurality of pixel units in a progressive manner, wherein i and j have a relationship of j=i+2.

Wherein the driving method for the display panel further comprises:

In a (n+2)th scanning period, the multiplexing switch receives four control signals, the first control switch, the fourth control switch, the sixth control switch, and the seventh control switch are controlled by the four control signals to let the four subpixels with different colors of the pixel unit on the (i+1)th row and x-th column be electrically connected with a corresponding data line according to a third sequence. The four subpixels with different colors of the pixel unit on the (i+1)th row and x-th column receive the data signals according to the third sequence.

In a (n+3)th scanning period, the multiplexing switch receives four control signals, the first control switch, the fourth control switch, the sixth control switch, and the seventh control switch are controlled by the four control signals to let the four subpixels with different colors of the pixel unit on the (i+3)th row and x-th column be electrically connected with a corresponding data line according to a fourth sequence. The four subpixels with different colors of the pixel unit on the (i+3)th row and x-th column receive the data signals according to the fourth sequence.

Wherein a color of the subpixel which last receives the data signal in the third sequence is the same as a color of the subpixel which first receives the data signal in the fourth sequence. Wherein the data signal of the subpixel which last receives the data signal in the third sequence is the same as the data signal of the subpixel which first receives the data signal in the fourth sequence.

Wherein the pixel unit on the i-th row and the x-th column sequentially comprises a red subpixel, a green subpixel, a blue subpixel, and a white subpixel along a row direction. The pixel unit on the (i+1)th row and the x-th column sequentially comprises a green subpixel, a white subpixel, a red subpixel, and a blue subpixel along the row direction. The pixel unit on the (i+2)th row and the x-th column sequentially comprises a red subpixel, a blue subpixel, a green subpixel, and a white subpixel along the row direction. The pixel unit on the (i+3)th row and the x-th column sequentially comprises a green subpixel, a white subpixel, a blue subpixel, and a red subpixel along the row direction.

Wherein an arrangement order of the subpixels in the pixel unit on the i-th row and (x+1)th column is the same as an arrangement order of the subpixels of the pixel unit on the i-th row and x-th column. An arrangement order of the subpixels in the pixel unit on the (i+4)th row and x-th column is the same as an arrangement order of the subpixels of the pixel unit on the i-th row and x-th column.

Wherein the data signal received by the white subpixel in each of the pixel units is at a low level, the data signals received by the red, green and blue subpixels in each of the pixel units are at a high level. In the first sequence and the third sequence, the white subpixel is the last subpixel which receives the data signal.

In the embodiments of the present invention, when the data signal received by the subpixel(s) of one color is different from the data signal received by the subpixel(s) of another color, an input order of the control signal is adjusted, so that the subpixel of the color in a previous scanning period of the two adjacent scanning periods last receives the data signal, and the subpixel of the color in one next to the previous scanning period first receives the data signal, so as to reduce the frequency of level-conversion of the data signal and further reduce the power consumption of the display panel.

BRIEF DESCRIPTION OF THE DRAWINGS

In order to describe the technical solutions in the embodiments of the present application more clearly, the accompanying drawings required for describing the embodiments are briefly introduced. Apparently, the accompanying drawings in the following description only show some embodiments of the present application. For those skilled in the art, other drawings may be obtained based on these drawings without any creative work.

FIG. 2 is a flow chart of a driving method for a display panel according to an embodiment of the present invention;

DETAILED DESCRIPTION OF THE PREFERRED EMBODIMENTS

Figure 1:
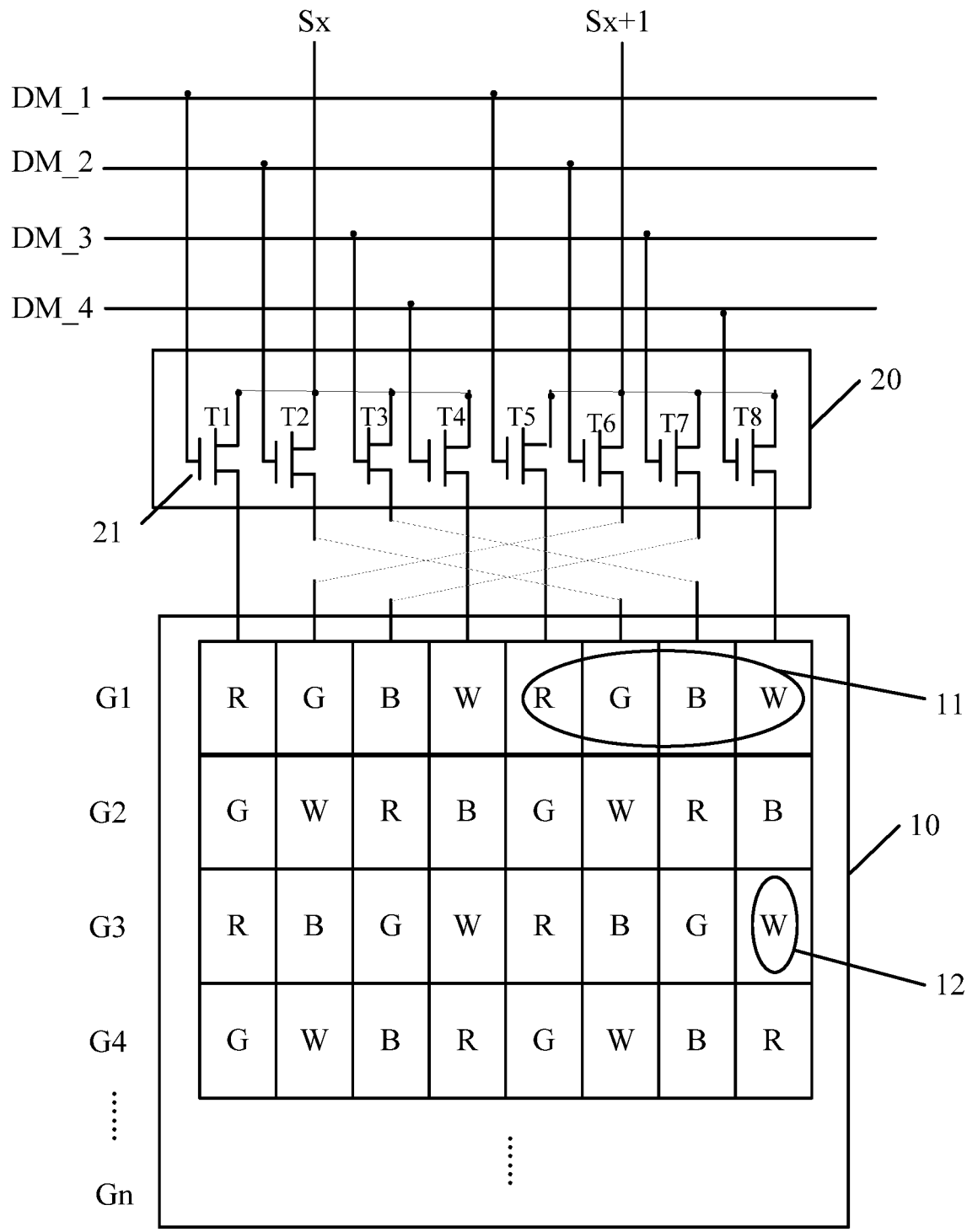
FIG. 1 is a circuit structure diagram of a driving unit in a display panel according to an embodiment of the present invention.

The technical solutions in the embodiments of the present invention will be described clearly and completely hereinafter with reference to the accompanying drawings in the embodiments of the present invention. Apparently, the described embodiments are some but not all embodiments of the present invention. All other embodiments obtained by a person of ordinary skill in the art based on the embodiments of the present invention without creative efforts shall fall within the protection scope of the present invention.

In addition, the following description of the embodiments is given with reference to the accompanying drawings, for the purpose of illustrating certain embodiments in which the invention may be practiced. Directional terms such as "up", "down", "front", "back", "left", "right", "inside", "outside", "side" are merely referred to the attached drawings. Therefore, the directional terms are used for better and more clearly illustrating and understanding the present invention, rather than indicating or implying that the device or element must have a specific orientation structure and operation, and thus cannot be understood as a limitation of the present invention.

In the description of the present invention, unless otherwise the context has clearly indication and limitation, it should be noted that the terms "mounted," "linked," and "connected" should be broadly understood, such as, "fixed connection", "removable connection", "integral connection", "mechanical connection", "direct connection", "indirect connection through an intermediary", or "internal communication between the two elements". For those skilled in the art, the specific meanings of the above terms in the present invention may be understood based on specific cases.

In addition, in the description of the present invention, unless otherwise specified, the meaning of "plural" is two or more. When the term "process" appears in the present specification, the term "process" is used to mean not only an independent process, but also an intentive effect that can be expected from the process unless clearly distinguished from other processes. The numerical range denoted by "~" in the present specification means a range including the numerical values described before and after "~" as the minimum value and the maximum value, respectively. In the drawings, elements that are similar in structure or the same are denoted by the same reference numerals.

A driving method for a display panel according to an embodiment of the present invention will be specifically described below with reference to FIG. 1 to FIG. 4.

It should be noted that the driving method for the display panel may be specifically applied to the display panel of the driving unit as shown in FIG. 1. The display panel in the embodiment of the present invention comprises a plurality of driving units. As shown in FIG. 1, each driving unit comprises a pixel module 10 and a multiplexing switch 20.

In the embodiment of the present invention, a to-be-displayed image data is transmitted to the pixel module 10 via the multiplexing switch 20 in the form of data voltage via two adjacent data lines; the scanning signals are output through n scanning lines, for controlling when the pixel module 10 receives the image data for image display. For ease of description, the two adjacent data lines are respectively defined as the x-th and (x+1)th data lines Sx and Sx+1; the n scanning lines are defined as first, second, . . . , (n−1)th, n-th scan lines G1, G2, . . . , Gn−1, Gn.

The pixel module 10 comprises a plurality of pixel units 11 arranged in a matrix of n rows and two columns corresponding to the two adjacent data lines, and the two rows of pixel units are respectively the x-th column and the (x+1)-th column of pixel units. For ease of description, the x-th column of pixel units 11 is defined as the first row and the x-th column, the second row and the x-th column, the i-th row and the x-th column, the (i+1) row and the x-th column, the (n−1)th row and the x-th column, the n-th row and the x-th column of pixel units 11.

Each of the pixel units 11 comprises a row and four columns of subpixels 12 arranged in a matrix with four different colors (they are respectively red, green, blue and white in the embodiment of the present disclosure, but not limited in other embodiments). In other words, the pixel module 10 comprises a plurality of subpixels 12 arranged in a matrix of n rows and eight columns.

The multiplexing switch 20 comprises eight control switches 21 (which are thin film transistors in the embodiment of the present invention, but not limited in other embodiments). For ease of description, the eight control switches 21 are respectively defined as first, second . . . seventh and eighth thin film transistors T1, T2 . . . T7 and T8.

Source electrodes of the first, second, third, and fourth thin film transistors T1, T2, T3, and T4 are all electrically connected with the x-th data line Sx. Source electrodes of the fifth, sixth, seventh, eighth thin film transistors T5, T6, T7 and T8 are all electrically connected with the (x+1)th data line Sx+1. Drain electrodes of the first, the second, the third, the fourth, the fifth, the sixth, the seventh, and the eighth thin film transistors T1, T2, T3, T4, T5, T6, T7, and T8 are respectively connected with the first, the sixth, the seventh, the fourth, the fifth, the second, the third, and the eighth columns of subpixels 12 of the pixel modules 10.

In one embodiment of the present invention, the pixel unit 11 on the i-th row and the x-th column of the pixel module 10 comprises a red subpixel R, a green subpixel a blue subpixel B, and a white subpixel W orderly along the row direction. The pixel unit 11 on the (i+1)th row and the x-th column comprises a green subpixel a white subpixel W, a red subpixel R, and a blue subpixel B orderly along the row direction. The pixel unit 11 on the (i+2)th row and the x-th column comprises a red subpixel R, a blue subpixel B, a green subpixel and a white subpixel W orderly along the row direction. The pixel unit 11 on the (i+3)th row and the x-th column of the pixel unit 11 comprises a green subpixel a white subpixel W, a blue subpixel B, and a red subpixel R orderly in the row direction. Where i=4N+1, N is a non-negative integer.

The arrangement orders of the subpixels 12 in the two pixel units 11 in the same row and different columns are the same, and the four rows of subpixels 12 are repeatedly arranged. That is to say, the arrangement order of the subpixels 12 of the m-th row and (x+1)th column of pixel unit 11 is the same as the arrangement order of the subpixels 12 of the m-th row and x-th column of pixel unit 11; the arrangement order of the subpixels 12 of the (m+4)th row and x-th column of pixel unit 11 is the same as the arrangement order of the subpixels 12 of the i-th row and x-th column of pixel unit 11. Where m is a natural number.

In each scanning period, a row of pixel cells 11 in the pixel module 10 is scanned by a scanning signal output by any of the scanning lines, the multiplexing switch 20 receives four control signals, which control the scanned each subpixel 12 in the pixel unit 11 receiving the data signals in a time-division manner. In the pulse period of each control signal, one of the subpixels 12 in the scanned pixel unit 11 receives the data signal.

Each control signals comprises four components, respectively, a first, a second, a third and a fourth component DM_1, DM_2, DM_3 and DM_4. Specifically, gate electrodes of the first and fifth thin film transistors receive the first component DM_1 of each control signals, gate electrodes of the second and sixth thin film transistors receive the second component DM_2 of each control signals, gate electrodes of the third and seventh thin film transistors receive the third component DM_3 of each control signals, and gate electrodes of the fourth and eighth thin film transistors receive the fourth component DM_4 of each control signals. One of the components of each control signals is high level and the other three components are low level.

In the embodiment of the present invention, the first, second, third, and fourth components DM_1, DM_2, DM_3, and DM_4 with high level are respectively defined as the first, second, third, and fourth control signals. The pulse period of each control signals is ¼ of the scanning period.

It should be noted that the scanning method adopted may comprise progressive and interlaced scanning, when scanning the pixel units 11.

When the scanning signals scan the pixel units 11 in progressive manner, the i-th row of pixel units 11 is scanned by the scanning signal output by the scanning line Gn in the nth scanning period; in the (n+1)th scanning period, the (i+1)th row of pixel units 11 is scanned by the scanning signal output by the scanning line Gn+1.

When the scanning signals scan the pixel units 11 in the interlaced manner, the i-th row of pixel units 11 is scanned by the scanning signal output by the scanning line Gn in the nth scanning period; in the (n+1)th scanning period, the (i+2)th row of pixel units 11 is scanned by the scanning signal output by the scanning line Gn+2; in the (n+2)th scanning period, the (i+1)th row of pixel units 11 is scanned by the scanning signal output by the scanning line Gn+1; In the (n+3)th scanning period, the (i+3)th row of pixel units 11 is scanned by the scanning signal output by the scanning line Gn+3.

Please refer to FIG. 2, which is a flow chart of a driving method for a display panel according to an embodiment of the present invention. The driving method for the display panel may be applied to a display panel having a driving unit as shown in FIG. 1. As shown in FIG. 2, the driving method for the display panel at least comprises the following steps:

S11, in an n-th scanning period, the pixel unit on the i-th row and an x-th column receives data signals. At least two subpixels with different colors on the i-th row and the x-th column of pixel unit receive the data signals according to a first sequence.

Wherein n, i, x is a natural number.

In a specific embodiment of the present invention, the scanning signals may scan the pixel module 10 in a progressive manner. The driving method for the display panel according to the embodiment of the present invention will be described below with reference to FIGS. 1-3.

In the n-th scanning period, the i-th row of the pixel units 11 is scanned by the scanning signal output by the scan line Gn. When i=4N+1 (where N is a non-negative integer), the multiplexing switch 20 sequentially receives the first, second, third and fourth control signals.

Specifically, the first and fifth thin film transistors T1 and T5 are controlled to be turned on by the first component DM_1 of the first control signal, the x-th data line Sx is electrically connected with the i-th row and the first column of the subpixel 12 (ie, the red subpixel R on the i-th row and the x-th column of pixel units 11) of the pixel module 10 through the first thin film transistor T1 and provides the data signal with high level to the red subpixel R, the (x+1)th data line Sx+1 is electrically connected with the i-th row and the fifth column of the subpixel 12 (ie, the red subpixel R on the (i+1)th row and the (x+1)th column of pixel units 11) of the pixel module 10 through the fifth thin film transistor T5 and provides the data signal with high level to the red subpixel R.

Then, the second and sixth thin film transistors T2 and T6 are controlled to be turned on by the second component DM_2 of the second control signal, the x-th data line Sx is electrically connected with the i-th row and the sixth column of the subpixel 12 (ie, the green subpixel G on the i-th row and the (x+1)th column of pixel units 11) of the pixel module 10 through the second thin film transistor T2 and provides the data signal with high level to the green subpixel the (x+1)th data line Sx+1 is electrically connected with the i-th row and the second column of the subpixel 12 (ie, the green subpixel G on the i-th row and the x-th column of pixel units 11) of the pixel module 10 through the sixth thin film transistor T6 and provides the data signal with high level to the green subpixel G.

Then, the third and seventh thin film transistors T3 and T7 are controlled to be turned on by the third component DM_3 of the third control signal, the x-th data line Sx is electrically connected with the i-th row and the seventh column of the subpixel 12 (ie, the blue subpixel B on the i-th row and the (x+1)th column of pixel units 11) of the pixel module 10 through the third thin film transistor T3 and provides the data signal with high level to the blue subpixel B, the (x+1)th data line Sx+1 is electrically connected with the i-th row and the third column of the subpixel 12 (ie, the blue subpixel B on the i-th row and the x-th column of pixel units 11) of the pixel module 10 through the seventh thin film transistor T7 and provides the data signal with high level to the blue subpixel B.

Finally, the fourth and eighth thin film transistors T4 and T8 are controlled to be turned on by the fourth component DM_4 of the fourth control signal, the x-th data line Sx is electrically connected with the i-th row and the fourth column of the subpixel 12 (ie, the white subpixel W on the i-th row and the x-th column of pixel units 11) of the pixel module 10 through the fourth thin film transistor T4 and provides the data signal with low level to the white subpixel W, the (x+1)th data line Sx+1 is electrically connected with the i-th row and the eighth column of the subpixel 12 (ie, the white subpixel W on the i-th row and the (x+1)th column of pixel units 11) of the pixel module 10 through the eighth thin film transistor T8 and provides the data signal with low level to the white subpixel W.

Therefore, in one embodiment of the present invention, the red subpixel R, the green subpixel the blue subpixel B, and the white subpixel W in the i-th row and the x-th column of pixel units 11 respectively receive data signals with high level, high level, high level, and low level. That is, the first sequence may be red, green, blue, and white.

S12, in an (n+1)th scanning period, the pixel unit on the j-th row and an x-th column receives data signals. At least two subpixels with different colors on the j-th row and the x-th column of pixel unit receive the data signals according to a second sequence.

Wherein j=i+1, a color of the subpixel which last receives the data signal in the first sequence is the same as a color of the subpixel which first receives the data signal in the second sequence. The data signal of the subpixel which last receives the data signal in the first sequence is the same as the data signal of the subpixel which first receives the data signal in the second sequence.

It should be noted that, the same data signals mean that both data signals are the same high level or low level.

In the (n+1)th scanning period, the (i+1)th row of the pixel unit 11 is scanned by the scanning signal output from the scanning line Gn+1, and the multiplexing switch 20 sequentially receives the second, first, third and fourth control signals.

Specifically, firstly, the second and the sixth thin film transistors T2 and T6 are turned on, and the x-th and (x+1)th data lines Sx and Sx+1 respectively supply the data signals with low level to the white subpixels W, which are in the (i+1) row and the (i+1)th column of pixel units 11 and the (i+1)th row and the x-th column of pixel units 11. Then, the first and fifth thin film transistors T1 and T5 are turned on, and the x-th and (x+1)th data lines Sx and Sx+1 respectively supply data signals with high level to the green subpixels which are in the (i+1)th row and the (x+1)th column of pixel units 11 and the (i+1)th and the (x+1)th column of the pixel unit 11. Then, the third and seventh thin film transistors T3 and T7 are turned on, and the x-th and (x+1)th data lines Sx and Sx+1 respectively supply the data signals with high level to red subpixels R, which are in the (i+1)th row and the (x+1)th column of pixel units 11 and the (i+1)th row and x-th column of the pixel units 11. Finally, the fourth and the eighth thin film transistors T4 and T8 are turned on, and the x-th and (x+1)th data lines Sx and Sx+1 respectively supply the data signals with high level to the blue subpixels B, which are in the (i+1)th row and the x-th column of pixel units 11 and the (i+1)th row and the (x+1)th column of the pixel units 11.

Therefore, in one embodiment of the present invention, the white subpixel W, the green subpixel the red subpixel R, and the blue subpixel B in the j-th row and the x-th column of pixel units 11 respectively receive data signals with low level, high level, high level, and high level. That is, the second sequence may be white, green, red, and blue. Where j=i+1.

Furthermore, in the (n+2)th scanning period, the (i+2)th row of the pixel unit 11 is scanned by the scanning signal output from the scanning line Gn+2, and the multiplexing switch 20 sequentially receives the first, second, third and fourth control signals.

Specifically, firstly, the first and the fifth thin film transistors T1 and T5 are turned on, and the x-th and (x+1)th data lines Sx and Sx+1 respectively supply the data signals with high level to the red subpixels R, which are in the (i+2) row and the x-th column of pixel units 11 and the (i+2)th row and the (x+1)th column of pixel units 11. Then, the second and sixth thin film transistors T2 and T6 are turned on, and the x-th and (x+1)th data lines Sx and Sx+1 respectively supply data signals with high level to the blue subpixels B, which are in the (i+2)th row and the (x+1)th column of pixel units 11 and the (i+2)th and the x-th column of the pixel unit 11. Then, the third and seventh thin film transistors T3 and T7 are turned on, and the x-th and (x+1)th data lines Sx and Sx+1 respectively supply the data signals with high level to the green subpixels which are in the (i+2)th row and the (x+1)th column of pixel units 11 and the (i+2)th row and x-th column of the pixel units 11. Finally, the fourth and the eighth thin film transistors T4 and T8 are turned on, and the x-th and (x+1)th data lines Sx and Sx+1 respectively supply the data signals with low level to the white subpixels W, which are in the (i+2)th row and the x-th column of pixel units 11 and the (i+2)th row and the (x+1)th column of the pixel units 11.

Furthermore, in the (n+3)th scanning period, the (i+3)th row of the pixel unit 11 is scanned by the scanning signal output from the scanning line Gn+3, and the multiplexing switch 20 sequentially receives the second, first, third and fourth control signals.

Specifically, firstly, the second and the sixth thin film transistors T2 and T6 are turned on, and the x-th and (x+1)th data lines Sx and Sx+1 respectively supply the data signals with low level to the white subpixels W, which are in the (i+3) row and the (i+1)th column of pixel units 11 and the (i+3)th row and the x-th column of pixel units 11. Then, the first and fifth thin film transistors T1 and T5 are turned on, and the x-th and (x+1)th data lines Sx and Sx+1 respectively supply data signals with high level to the green subpixels which are in the (i+3)th row and the x-th column of pixel units 11 and the (i+3)th and the (x+1)th column of the pixel unit 11. Then, the third and seventh thin film transistors T3 and T7 are turned on, and the x-th and (x+1)th data lines Sx and Sx+1 respectively supply the data signals with high level to blue subpixels B, which are in the (i+3)th row and the (x+1)th column of pixel units 11 and the (i+3)th row and x-th column of the pixel units 11. Finally, the fourth and the eighth thin film transistors T4 and T8 are turned on, and the x-th and (x+1)th data lines Sx and Sx+1 respectively supply the data signals with high level to the red subpixels R, which are in the (i+3)th row and the x-th column of pixel units 11 and the (i+3)th row and the (x+1)th column of the pixel units 11.

Figure 3:
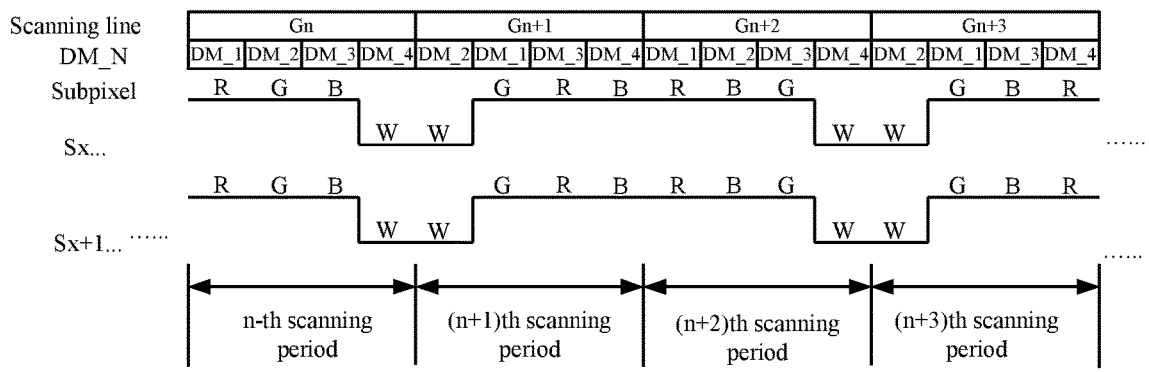
FIG. 3 is a display time-domain diagram according to an embodiment of the present invention.

It should be noted that, in FIG. 3, the display time-domain diagram corresponding to the (i+4)th row of the pixel unit 11 is the same as the display time-domain diagram corresponding to the i-th row of the pixel unit 11. Therefore, for the driving method for the display panel in other scanning periods, please refer to the driving method for the display panel in the above corresponding scanning period.

When each of the white subpixels W in the pixel module 10 receives the data signals with low level; each of the red subpixels R, green subpixels G, and blue subpixels B receives the data signal with high level, if the input sequence of the control signal is adjusted by the display time-domain diagram as shown in FIG. 3, the data signals provided by the x-th and the (x+1)th data lines Sx and Sx+1 only need to perform one level-conversion every two scanning periods. However, in the embodiment in which the multiplexing switch 20 sequentially receives the first, second, third, and fourth control signals in each scanning period, the data signals provided by the x-th, (x+1)th data lines Sx, Sx need to perform three level-conversions every two scanning periods. Therefore, the driving method for the display panel according to the embodiment of the present invention reduces the frequency of the level-conversion of the data signal, thereby reducing the power consumption of the display panel.

In a specific embodiment of the present invention, the scanning signals may scan the pixel module 10 in an interlaced manner. The driving method for the display panel according to the embodiment of the present invention will be described below with reference to FIGS. 1-2, 4.

In the n-th scanning period, the i-th row of the pixel units 11 is scanned by the scanning signal output by the scan line Gn. When i=4N+1 (where N is a non-negative integer), the multiplexing switch 20 sequentially receives the first, second, third and fourth control signals.

It should be noted that when the multiplexing switch 20 sequentially receives the first, second, third and fourth control signals, the specific details of providing the data signals to the i-th row of the pixel unit 11 by the x-th and (x+1)th data lines Sx and Sx+1 (ie, the specific technical details that the i-th row of the pixel unit 11 receives the data signal), please refer to the corresponding description of S11 in the above specific embodiment.

In the (n+1)th scanning period, the (i+2)th row of the pixel unit 11 is scanned by the scanning signal output from the scanning line Gn+2, and the multiplexing switch 20 sequentially receives the fourth, third, second and first control signals.

Specifically, first, the fourth and the eighth thin film transistors T4 and T8 are turned on, and the x-th and (x+1)th data lines Sx and Sx+1 respectively supply the data signals with low level to the white subpixels W, which are in the (i+2) row and the x-th column of pixel units 11 and the (i+2)th row and the (x+1)th column of pixel units 11. Then, the third and seventh thin film transistors T3 and T7 are turned on, and the x-th and (x+1)th data lines Sx and Sx+1 respectively supply data signals with high level to the green subpixels Q which are in the (i+2)th row and the (x+1)th column of pixel units 11 and the (i+1)th and the x-th column of the pixel unit 11. Then, the second and sixth thin film transistors T2 and T6 are turned on, and the x-th and (x+1)th data lines Sx and Sx+1 respectively supply the data signals with high level to blue subpixels B, which are in the (i+2)th row and the (x+1)th column of pixel units 11 and the (i+2)th row and x-th column of the pixel units 11. Finally, the first and the fifth thin film transistors T1 and T5 are turned on, and the x-th and (x+1)th data lines Sx and Sx+1 respectively supply the data signals with high level to the red subpixels R, which are in the (i+2)th row and the x-th column of pixel units 11 and the (i+2)th row and the (x+1)th column of the pixel units 11.

Therefore, in one embodiment of the present invention, the white subpixel W, the green subpixel the blue subpixel B, and the red subpixel R in the j-th row and the x-th column of pixel units 11 respectively receive data signals with low level, high level, high level, and high level. That is, the second sequence may be white, green, blue, and red. Where j=i+2.

Furthermore, in the (n+2)th scanning period, the (i+1)th row of the pixel unit 11 is scanned by the scanning signal output from the scanning line Gn+1, and the multiplexing switch 20 sequentially receives the first, third, fourth, and second control signals.

Specifically, firstly, the first and the fifth thin film transistors T1 and T5 are turned on, and the x-th and (x+1)th data lines Sx and Sx+1 respectively supply the data signals with high level to the green subpixels which are in the (i+1) row and the x-th column of pixel units 11 and the (i+1)th row and the (x+1)th column of pixel units 11. Then, the third and seventh thin film transistors T3 and T7 are turned on, and the x-th and (x+1)th data lines Sx and Sx+1 respectively supply data signals with high level to the red subpixels R, which are in the (i+1)th row and the (x+1)th column of pixel units 11 and the (i+1)th and the x-th column of the pixel unit 11. Then, the fourth and eighth thin film transistors T4 and T8 are turned on, and the x-th and (x+1)th data lines Sx and Sx+1 respectively supply the data signals with high level to the blue subpixels B, which are in the (i+1)th row and the x-th column of pixel units 11 and the (i+1)th row and (x+1)th column of the pixel units 11. Finally, the second and the sixth thin film transistors T2 and T6 are turned on, and the x-th and (x+1)th data lines Sx and Sx+1 respectively supply the data signals with low level to the white subpixels W, which are in the (i+1)th row and the (x+1)th column of pixel units 11 and the (i+1)th row and the x-th column of the pixel units 11.

Furthermore, in the (n+3)th scanning period, the (i+3)th row of the pixel unit 11 is scanned by the scanning signal output from the scanning line Gn+3, and the multiplexing switch 20 sequentially receives the second, third, fourth, and first control signals.

Specifically, firstly, the second and the sixth thin film transistors T2 and T6 are turned on, and the x-th and (x+1)th data lines Sx and Sx+1 respectively supply the data signals with low level to the white subpixels W, which are in the (i+3) row and the (x+1)th column of pixel units 11 and the (i+3)th row and the x-th column of pixel units 11. Then, the third and seventh thin film transistors T3 and T7 are turned on, and the x-th and (x+1)th data lines Sx and Sx+1 respectively supply data signals with high level to the blue subpixels B, which are in the (i+3)th row and the (x+1)th column of pixel units 11 and the (i+3)th and the x-th column of the pixel unit 11. Then, the fourth and eighth thin film transistors T4 and T8 are turned on, and the x-th and (x+1)th data lines Sx and Sx+1 respectively supply the data signals with high level to red subpixels R, which are in the (i+3)th row and the x-th column of pixel units 11 and the (i+3)th row and (x+1)th column of the pixel units 11. Finally, the first and the fifth thin film transistors T1 and T5 are turned on, and the x-th and (x+1)th data lines Sx and Sx+1 respectively supply the data signals with high level to the green subpixels which are in the (i+3)th row and the x-th column of pixel units 11 and the (i+3)th row and the (x+1)th column of the pixel units 11.

Figure 4:
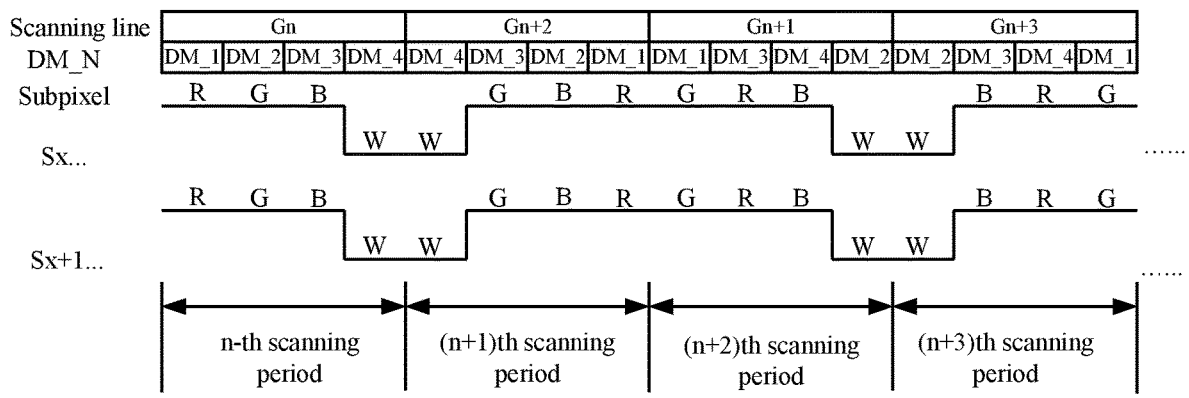
FIG. 4 is another display time-domain diagram according to an embodiment of the present invention.

It should be noted that, in FIG. 4, the display time-domain diagram corresponding to the (i+4)th row of the pixel unit 11 is the same as the display time-domain diagram corresponding to the i-th row of the pixel unit 11. Therefore, for the driving method for the display panel in other scanning periods, please refer to the driving method for the display panel in the above corresponding scanning period.

When each of the white subpixels W in the pixel module 10 receives the data signals with low level; each of the red subpixels R, green subpixels and blue subpixels B receives the data signal with high level, if the input sequence of the control signal is adjusted by the display time-domain diagram as shown in FIG. 4, the data signals provided by the x-th and the (x+1)th data lines Sx and Sx+1 only need to perform one level-conversion every two scanning periods. Furthermore, in the two adjacent scanning periods, the thin film transistor that is lastly turned on in the previous scanning period is the same as the thin film transistor that is firstly turned on in the next scanning period; comparing with the embodiment in which the multiplexing switch 20 sequentially receives the first, second, third, and fourth control signals in each scanning period, the driving method for the display panel in the embodiment of the present invention not only reduces the frequency of level-conversion of the data line but also reduces the frequency of switching the state of the thin film transistor (ie, the frequency of switching between on and off), thereby reducing the display panel power consumption.

In the description of the present specification, the description with reference to the terms "one embodiment," "some embodiments," "an example," "a specific example," "some examples," and the like means a particular feature described in connection with the embodiment or example. The structures, materials, or characteristics are included in at least one embodiment or example of the present invention. In this specification, the schematic representation of the above terms does not necessarily refer to the same embodiment or example. Furthermore, the particular features, structures, materials, or characteristics described may be combined in any suitable manner in any one or more embodiments or examples.

The driving method for a display panel according to the embodiments of the present invention is described in detail above. Specific examples are used herein to describe the principle and implementation manners of the present invention. The description of the foregoing embodiments is merely intended to help understanding of the present invention methods and core ideas thereof; meanwhile, those skilled in the art may make changes to the specific implementation manners and the application scope according to the ideas of the present invention. In view of the foregoing, the contents of the description should not be construed as a limitation of the present invention.

What is claimed is:

1. A driving method for a display panel, wherein the display panel comprises a plurality of rows and columns of pixel units arranged in a matrix, each of the pixel units comprises at least two subpixels with different colors and the at least two subpixels of each of the pixel units are arranged in an arrangement sequence, wherein in each scanning period, scanning signals scan one of the rows of the pixel units, and the driving method for the display panel comprises:

in an n-th scanning period, receiving data signals by the pixel unit on the i-th row and an x-th column, wherein the at least two subpixels with different colors on the i-th row and the x-th column of pixel unit receive the data signals according to a first activating sequence such that the at least two subpixels are activated to display different colors in a first color displaying sequence that is determined according to the arrangement sequence of the at least two subpixels of the i-th row and the x-th column and the first activating sequence, wherein each of n, i, and x is a natural number;

in an (n+1)th scanning period, receiving data signals by the pixel unit on the j-th row and an x-th column, wherein the at least two subpixels with different colors on the j-th row and the x-th column of pixel unit receive the data signals according to a second activating sequence such that the at least two subpixels are activated to display different colors in a second color displaying sequence that is determined according to the arrangement sequence of the at least two subpixels of the j-th row and the x-th column and the second activating sequence, wherein j and i are different natural numbers;

wherein the arrangement sequence of the at least two subpixels of the i-th row and the x-th column and the arrangement sequence of the at least two subpixels of the j-th row and the x-th column are each a fixed sequence and second activating sequence is different from the first activating sequence such that the second color displaying sequence is different from the first color display sequence and such that a color of the first color displaying sequence that is displayed by the subpixel which last receives the data signal in the first activating sequence is the same as a color of the second color displaying sequence that is displayed by the subpixel which first receives the data signal in the second activating sequence, wherein the data signal of the subpixel which last receives the data signal in the first activating sequence is the same as the data signal of the subpixel which first receives the data signal in the second activating sequence such that the data signal of the subpixel which last receives the data signal in the first activating sequence is the same as the data signal of the subpixel which first receives the data signal in the second activating sequence are both high level or both low level.

2. The driving method for the display panel according to claim 1, wherein each column of the pixel units comprises at least two columns of subpixels, each column of the pixel units corresponds to a data line and a multiplexing switch, and the data line is configured to provide the data signals, and the multiplexing switch comprises at least two control switches, each of the control switches is electrically connected with the data line and one column of subpixels, and each of the control switches is electrically connected to the different columns of subpixels; and the driving method for the display panel further comprises:

in the n-th scanning period, receiving at least two control signals by the multiplexing switch, wherein the at least two control signals control the at least two control switches to let the data lines and the at least two subpixels with different colors of the pixel unit on the i-th row and the x-th column be electrically connected, according to the first sequence;

in the (n+1)th scanning period, receiving at least two control signals by the multiplexing switch, wherein the at least two control signals control the at least two control switches to let the data lines and the at least two subpixels with different colors of the pixel unit of the j-th row and the x-th column be electrically connected, according to the second sequence.

3. The driving method for the display panel according to claim 2, wherein each of the control signals controls one of the at least two control switches to turn on, and the data line is electrically connected with the subpixel which is electrically connected with the control switch after each of the control switches is turned on.

4. The driving method for the display panel according to claim 2, wherein the scanning signals scan the plurality of pixel units in a progressive manner, wherein i and j have a relationship of j=i+1.

5. The driving method for the display panel according to claim 3, wherein each of the pixel units comprises four subpixels with different colors, each column of the pixel units comprises four columns of subpixels, the multiplexing switch comprises four control switches, and an m-th control switch is electrically connected with the data line and the m-th column of subpixels; wherein m is a natural number between 1 and 4.

6. The driving method for the display panel according to claim 3, wherein the scanning signals scan the plurality of pixel units in a progressive manner, wherein i and j have a relationship of j=i+1.

7. The driving method for the display panel according to claim 5, wherein in each scanning period, the multiplexing switch receives four control signals, each of the control signals comprises four components, the control switch is a thin film transistor, a source electrode of a m-th thin film transistor is electrically connected with the data line, a drain electrode of the m-th thin film transistor is electrically connected with a m-th column of subpixels, and a gate electrode of the m-th TFT receives a m-th component of each control signal in each scanning period.

8. The driving method for the display panel according to claim 5, wherein the scanning signals scan the plurality of pixel units in a progressive manner, wherein i and j have a relationship of j=i+1.

9. The driving method for the display panel according to claim 7, wherein the scanning signals scan the plurality of pixel units in a progressive manner, wherein i and j have a relationship of j=i+1.

10. The driving method for the display panel according to claim 1, wherein each of the pixel units comprises four subpixels with different colors, each two columns of pixel units comprise eight columns of subpixels, two adjacent columns of the pixel units correspond to two data lines and a multiplexing switch, the two data lines are used to provide data signals, and the multiplexing switch comprises eight control switches; when m is 1 or 4, a m-th control switch is electrically connected with a first data line and a m-th column of subpixels; when m is 2 or 3, the m-th control switch is electrically connected with the first data line and a (m+4)th column of subpixels; when m is 5 or 8, the m-th control switch is electrically connected with a second data line and the m-th column of subpixels; when m is 6 or 7, the m-th control switch is electrically connected to the second data line and the (m−4)th column of subpixels; and the driving method for the display panel further comprises:

in the n-th scanning period, receiving four control signals by the multiplexing switch receives, controlling a first control switch, a fourth control switch, a sixth control switch, and a seventh control switch by the four control signals to let the four subpixels with different colors of the pixel unit on the i-th row and x-th column be electrically connected with a corresponding data line according to the first sequence;

in the (n+1)th scanning period, receiving four control signals by the multiplexing switch, controlling the first control switch, the fourth control switch, the sixth control switch, and the seventh control switch by the four control signals to let the four subpixels with different colors of the pixel unit on the j-th row and x-th column be electrically connected with a corresponding data line according to the second sequence.

11. The driving method for the display panel according to claim 10, wherein the scanning signals scan the plurality of pixel units in a progressive manner, wherein i and j have a relationship of j=i+1.

12. The driving method for the display panel according to claim 10, wherein the scanning signals scan the plurality of pixel units in a progressive manner, wherein i and j have a relationship of j=i+2.

13. The driving method for the display panel according to claim 12, wherein the driving method for the display panel further comprises:
in a (n+2)th scanning period, receiving four control signals by the multiplexing switch, controlling the first control switch, the fourth control switch, the sixth control switch, and the seventh control switch by the four control signals to let the four subpixels with different colors of the pixel unit on the (i+1)th row and x-th column be electrically connected with a corresponding data line according to a third sequence, wherein the four subpixels with different colors of the pixel unit on the (i+1)th row and x-th column receive the data signals according to the third sequence;
in a (n+3)th scanning period, receiving four control signals by the multiplexing switch, controlling the first control switch, the fourth control switch, the sixth control switch, and the seventh control switch by the four control signals to let the four subpixels with different colors of the pixel unit on the (i+3)th row and x-th column be electrically connected with a corresponding data line according to a fourth sequence, wherein the four subpixels with different colors of the pixel unit on the (i+3)th row and x-th column receive the data signals according to the fourth sequence;
wherein a color of the subpixel which last receives the data signal in the third sequence is the same as a color of the subpixel which first receives the data signal in the fourth sequence, wherein the data signal of the subpixel which last receives the data signal in the third sequence is the same as the data signal of the subpixel which first receives the data signal in the fourth sequence.

14. The driving method for the display panel according to claim 13, wherein
the pixel unit on the i-th row and the x-th column sequentially comprises a red subpixel, a green subpixel, a blue subpixel, and a white subpixel along a row direction;
the pixel unit on the (i+1)th row and the x-th column sequentially comprises a green subpixel, a white subpixel, a red subpixel, and a blue subpixel along the row direction;
the pixel unit on the (i+2)th row and the x-th column sequentially comprises a red subpixel, a blue subpixel, a green subpixel, and a white subpixel along the row direction;
the pixel unit on the (i+3)th row and the x-th column sequentially comprises a green subpixel, a white subpixel, a blue subpixel, and a red subpixel along the row direction;
an arrangement order of the subpixels in the pixel unit on the i-th row and (x+1)th column is the same as an arrangement order of the subpixels of the pixel unit on the i-th row and x-th column, an arrangement order of the subpixels in the pixel unit on the (i+4)th row and x-th column is the same as an arrangement order of the subpixels of the pixel unit on the i-th row and x-th column.

15. The driving method for the display panel according to claim 13, wherein the data signal received by the white subpixel in each of the pixel units is at a low level, the data signals received by the red, green and blue subpixels in each of the pixel units are at a high level; in the first sequence and the third sequence, the white subpixel is the last subpixel which receives the data signal.

16. The driving method for the display panel according to claim 14, wherein the data signal received by the white subpixel in each of the pixel units is at a low level, the data signals received by the red, green and blue subpixels in each of the pixel units are at a high level; in the first sequence and the third sequence, the white subpixel is the last subpixel which receives the data signal.

17. The driving method for the display panel according to claim 1, wherein the scanning signals scan the plurality of pixel units in a progressive manner, wherein i and j have a relationship of j=i+1.

* * * * *